United States Patent
Malek et al.

(10) Patent No.: US 10,720,881 B2
(45) Date of Patent: Jul. 21, 2020

(54) SYSTEMS AND METHODS FOR PASSIVELY COOLING PHOTOVOLTAIC MODULES

(71) Applicant: FORD GLOBAL TECHNOLOGIES, LLC, Dearborn, MI (US)

(72) Inventors: Hadi Malek, Dearborn, MI (US); Daniel Boston, Dearborn, MI (US); Jacob Mathews, Canton, MI (US); Brett Stephens, Detroit, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 316 days.

(21) Appl. No.: 15/232,869

(22) Filed: Aug. 10, 2016

(65) Prior Publication Data
US 2018/0048262 A1    Feb. 15, 2018

(51) Int. Cl.
| | | |
|---|---|---|
| *H01L 31/042* | (2014.01) | |
| *H02S 40/42* | (2014.01) | |
| *H02S 40/38* | (2014.01) | |
| *H02S 20/30* | (2014.01) | |
| *H01L 31/048* | (2014.01) | |

(52) U.S. Cl.
CPC .......... *H02S 40/425* (2014.12); *H01L 31/048* (2013.01); *H02S 20/30* (2014.12); *H02S 40/38* (2014.12)

(58) Field of Classification Search
CPC ........ H02S 40/425; H02S 40/38; H02S 20/30; H01L 31/048
USPC ................. 136/200–242, 246, 259
See application file for complete search history.

(56) References Cited

U.S. PATENT DOCUMENTS

| | | | | |
|---|---|---|---|---|
| 3,842,596 A | * | 10/1974 | Gray | F01D 5/088 165/104.25 |
| 4,658,599 A | * | 4/1987 | Kajiwara | B60H 1/00428 136/291 |
| 5,947,111 A | * | 9/1999 | Neulander | F28D 15/0275 122/448.1 |
| 6,964,294 B2 | | 11/2005 | Hendricks et al. | |
| 2003/0221717 A1 | * | 12/2003 | Dessel | F24F 5/0042 136/206 |
| 2008/0083450 A1 | * | 4/2008 | Benoit | H01L 31/052 136/246 |
| 2011/0048496 A1 | * | 3/2011 | Foong | F24J 2/14 136/246 |
| 2012/0037210 A1 | * | 2/2012 | Lim | F28D 15/0233 136/246 |
| 2015/0175024 A1 | | 6/2015 | Bell et al. | |
| 2016/0089970 A1 | | 3/2016 | Jackson | |

FOREIGN PATENT DOCUMENTS

| | | |
|---|---|---|
| CN | 201434625 Y | 3/2010 |
| CN | 102305488 A | 1/2012 |
| CN | 104192101 A | 12/2014 |
| CN | 105459967 A | 4/2016 |
| EP | 2497661 B1 | 4/2013 |

* cited by examiner

*Primary Examiner* — Thanh Truc Trinh
(74) *Attorney, Agent, or Firm* — David B. Kelley; Carlson, Gaskey & Olds

(57) ABSTRACT

An assembly includes a photovoltaic module including a solar cell and a cooling system including a heat pipe adapted to dissipate heat from the solar cell. A method includes dissipating heat from the solar cell using the heat pipe. The photovoltaic module may be disposed on a vehicle to convert solar energy into electricity.

19 Claims, 3 Drawing Sheets

SYSTEMS AND METHODS FOR PASSIVELY COOLING PHOTOVOLTAIC MODULES

TECHNICAL FIELD

This disclosure relates to a photovoltaic module. A heat pipe cooling system may be employed to dissipate heat from a solar cell of the photovoltaic module.

BACKGROUND

The need to improve the energy efficiency of automotive vehicles has been well documented. Efforts have therefore been untaken to utilize alternative energy sources to power vehicle loads. For example, vehicles equipped with photovoltaic modules, or solar panels, utilize solar energy captured from the sun. The photovoltaic modules convert the solar energy into electricity for charging the vehicle battery or for powering various other electrical loads. The operating temperatures of solar cells increase during the photovoltaic conversion process. Solar cell performance often decreases as its operating temperature increases.

SUMMARY

An assembly according to an exemplary aspect of the present disclosure includes, among other things, a photovoltaic module including a solar cell and a cooling system including a heat pipe adapted to dissipate heat from the solar cell.

In a further non-limiting embodiment of the foregoing assembly, the photovoltaic module is mounted to a roof component of a vehicle.

In a further non-limiting embodiment of either of the foregoing assemblies, the cooling system includes a thermal conductor disposed between the solar cell and the heat pipe.

In a further non-limiting embodiment of any of the foregoing assemblies, the thermal conductor is a thermally conductive sheet.

In a further non-limiting embodiment of any of the foregoing assemblies, the thermal conductor is a glass pipe.

In a further non-limiting embodiment of any of the foregoing assemblies, the thermal conductor is a thermal grease.

In a further non-limiting embodiment of any of the foregoing assemblies, the cooling system includes a heatsink, and the heat pipe extends between the solar cell and the heatsink.

In a further non-limiting embodiment of any of the foregoing assemblies, the heatsink includes a metallic body and a plurality of cooling fins that protrude from the metallic body.

In a further non-limiting embodiment of any of the foregoing assemblies, the heat pipe includes an evaporation section proximate the solar cell and a condenser section proximate a heatsink of the cooling system.

In a further non-limiting embodiment of any of the foregoing assemblies, a working medium is movable inside the heat pipe between the evaporation section and the condenser section.

In a further non-limiting embodiment of any of the foregoing assemblies, the working medium moves via gravity or capillary forces.

In a further non-limiting embodiment of any of the foregoing assemblies, the heat pipe is a thermosyphon.

In a further non-limiting embodiment of any of the foregoing assemblies, the assembly is a vehicle assembly.

In a further non-limiting embodiment of any of the foregoing assemblies, the heat pipe includes an evaporation section and a condenser section elevated relative to the evaporation section.

A method according to another exemplary aspect of the present disclosure includes, among other things, dissipating heat from a solar cell of a photovoltaic module using a heat pipe.

In a further non-limiting embodiment of the foregoing method, dissipating the heat includes absorbing the heat from the solar cell into an evaporation section of the heat pipe.

In a further non-limiting embodiment of either of the foregoing methods, the method includes vaporizing a working medium inside the evaporation section and communicating the vaporized working medium to a condenser section of the heat pipe.

In a further non-limiting embodiment of any of the foregoing methods, the method includes condensing the working medium in the condenser section to release the heat to a heatsink.

In a further non-limiting embodiment of any of the foregoing methods, the method includes releasing the heat to a heatsink connected to a section of the heat pipe that is remote from the solar cell.

A vehicle according to another exemplary aspect of the present disclosure includes, among other things, a battery, a photovoltaic module configured to convert solar energy into electricity for charging the battery and a cooling system including at least one heat pipe adapted to passively dissipate heat from the photovoltaic module.

The embodiments, examples and alternatives of the preceding paragraphs, the claims, or the following description and drawings, including any of their various aspects or respective individual features, may be taken independently or in any combination. Features described in connection with one embodiment are applicable to all embodiments, unless such features are incompatible.

The various features and advantages of this disclosure will become apparent to those skilled in the art from the following detailed description. The drawings that accompany the detailed description can be briefly described as follows.

DETAILED DESCRIPTION

This disclosure describes a photovoltaic module, such as for a vehicle. The photovoltaic module includes one or more solar cells. A cooling system having one more heat pipes is adapted to dissipate heat from the solar cells. The heat may be dissipated to a heatsink located remotely from the solar cells. These and other features are discussed in greater detail in the following paragraphs of this detailed description.

Figure 1:
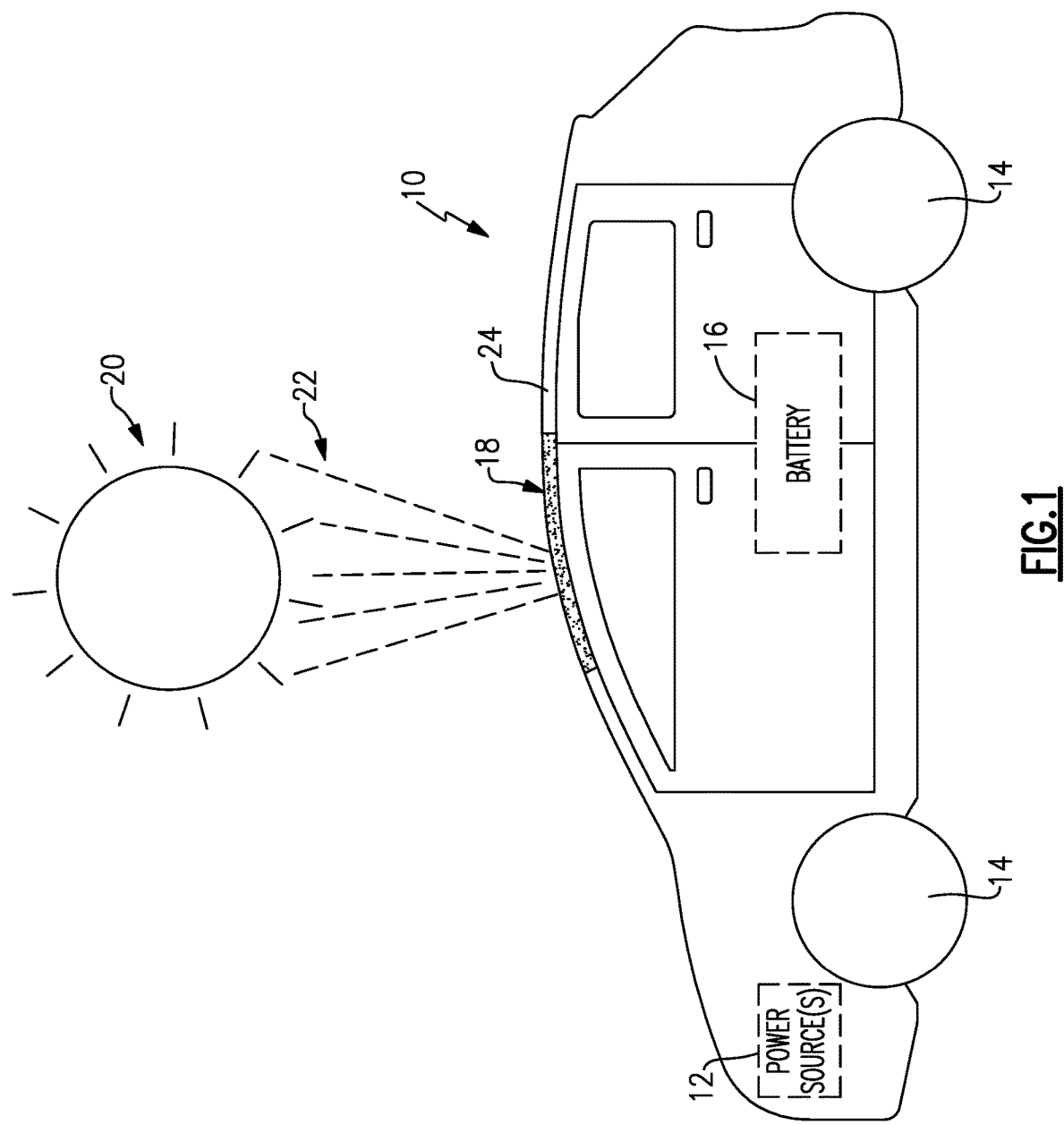
FIG. 1 schematically illustrates a vehicle equipped with a photovoltaic module.

FIG. 1 schematically illustrates a vehicle 10. Although an exemplary component relationship of the vehicle 10 is illustrated in FIG. 1, this illustration is highly schematic and is not intended to limit this disclosure. The placement and orientation of the various components of the vehicle 10 could vary from vehicle to vehicle.

The vehicle 10 could include a traditional powertrain or an electrified powertrain and includes one or more power sources 12. In a first non-limiting embodiment, the power source 12 is an engine if the vehicle 10 includes a conventional powertrain. In another non-limiting embodiment, the power source 12 is an electric machine (e.g., an electric motor, a generator, or a combined motor/generator) if the vehicle 10 includes an electrified powertrain. In yet another non-limiting embodiment, the power source 12 includes both an engine and an electric machine if the vehicle 10 includes a hybrid powertrain. The power source(s) 12 generate torque to drive one or more sets of drive wheels 14 of the vehicle 10.

A battery 16 stores electrical energy for powering various electrical loads of the vehicle 10. The battery 16 may be mounted anywhere on the vehicle 10. In a first non-limiting embodiment, the battery 16 is a low voltage battery used to power low voltage vehicle systems, such as lighting systems, logic circuitry, etc. In another non-limiting embodiment, the battery 16 is a high voltage traction battery pack that includes a plurality of battery cells or other energy storage devices capable of outputting electrical power to power high voltage loads of the vehicle 10, such as an electric machine, etc.

The vehicle 10 additionally includes a photovoltaic module 18 for capturing and utilizing solar energy from the sun 20. The photovoltaic module 18 may also be referred to as a solar panel or solar array. In a non-limiting embodiment, the photovoltaic module 18 is mounted to a roof component 24 of the vehicle 10. However, the photovoltaic module 18 could be mounted or attached to any portion of the vehicle 10.

Although not shown, a solar concentrator that includes a series of lenses may focus solar rays 22 from the sun 20 at a concentrated region or a focal point that is directed onto solar cells of the photovoltaic module 18 when the vehicle 10 is parked relative to the solar concentrator. The photovoltaic module 18 utilizes the photovoltaic effect to absorb photons of light and release electrons that can be captured to create an electric current. The electric current can be used to power various vehicle loads, such as for charging the battery 16, etc.

Operating temperatures of the photovoltaic module 18 may increase as the solar cells of the photovoltaic module 18 collect solar energy from the sun 20. If the operating temperatures of the photovoltaic module 18 become too high, solar cell performance may decrease. It may therefore be beneficial to cool the solar cells of the photovoltaic module 18. Exemplary cooling systems for passively cooling the photovoltaic module 18 using one or more heat pipes are detailed below.

Figure 2A:
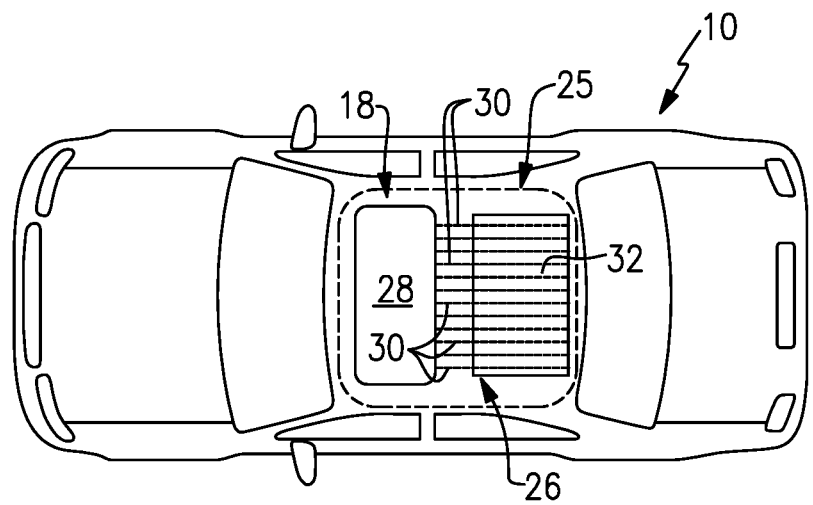
FIGS. 2A and 2B illustrate a cooling system for cooling a photovoltaic module.
Figure 2B:
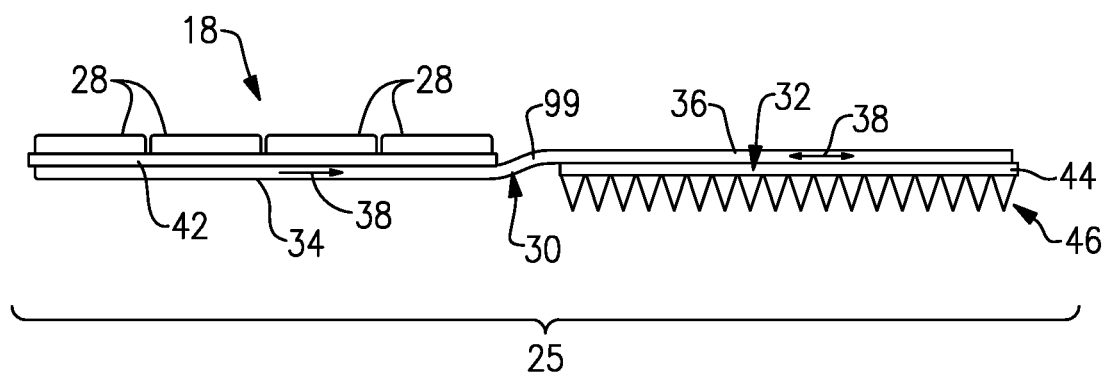

FIGS. 2A and 2B illustrate an exemplary cooling system 26 for passively cooling a photovoltaic module 18. Together, the photovoltaic module 18 and the cooling system 26 establish an assembly 25. In a non-limiting embodiment, the assembly is a vehicle assembly of the vehicle 10.

The cooling system 26 is considered "passive" because the heat dissipation is generally achieved without consuming power. Therefore, the cooling system 26 does not influence the overall efficiency of the vehicle 10.

The photovoltaic module 18 may include a plurality of solar cells 28. The specific number of solar cells 28 provided within the photovoltaic module 18 may vary and is not intended to limit this disclosure. In addition, the solar cells 28 may be monocrystalline silicon solar cells, thin film solar cells, multijunction solar cells, or any other type of solar cells.

The solar cells 28 of the photovoltaic module 18 generate heat during the process of converting solar energy into electricity. The cooling system 26 is designed to dissipate this heat away from the solar cells 28 in order to improve the performance of the photovoltaic module 18. In a non-limiting embodiment, the cooling system 26 includes one or more heat pipes 30 and a heatsink 32. The heat pipes 30 transfer heat from the solar cells 28 to the heatsink 32 to cool the solar cells 28.

In a first non-limiting embodiment, the heatsink 32 is a portion of the vehicle 10, such as a body panel. In another non-limiting embodiment, the heatsink 32 is a separate component mounted to the vehicle 10 at a location remote from the photovoltaic module 18. The heatsink 32 may be made of aluminum. However, other materials are also contemplated within the scope of this disclosure.

In another non-limiting embodiment, best shown in FIG. 2B, the heatsink 32 includes a body 44 and a plurality of heat transfer devices 46 that protrude from the body 44. The heat transfer devices 46 may be configured as cooling fins, cooling pins, or any other suitable heat transfer device.

Each heat pipe 30 includes an evaporation section 34 and a condenser section 36. The evaporation section 34 is contiguous with or near the solar cells 28, and the condenser section 36 is contiguous with or near the heatsink 32. The heat pipes 30 may utilize an evaporative cooling cycle to transfer thermal energy from the solar cells 28 to the heatsink 32 by continuously evaporating and condensing a working medium 38 housed inside the heat pipes 30. The working medium 38 may be ammonia, water, or any other medium. Thermal energy absorbed by the solar cells 28 heats the evaporation section 34 and causes the working medium 38 to evaporate. The working medium 38 may then move toward the condenser section 36, which has a lower temperature compared to the evaporation section 34. The heatsink 32 absorbs energy from the condenser section 36, thus causing the vaporized working medium 38 to condense back into a liquid phase.

The working medium 38 moves between the evaporation section 34 and the condenser section 36 to transfer thermal energy between the solar cells 28 and the heatsink 32. In a non-limiting embodiment, the heat pipes 30 use gravitational forces to move the working medium 38 and facilitate the heat transfer. For example, the condenser section 36 may be slightly elevated relative to the evaporation section 34 such that the condensed working medium 38 may return to the evaporation section 34 with the aid of gravity. Thus, in this non-limiting embodiment, the heat pipes 30 are thermosyphons. In another non-limiting embodiment, an angled section 99 of the heat pipe 30 elevates the condenser section 36 relative to the evaporation section 34.

A thermal conductor 42 may optionally be disposed between the solar cells 28 and the evaporation section 34 of each heat pipe 30 to facilitate the transfer of thermal energy between these components. Any thermally conductive and electrically non-conductive material may be utilized as the thermal conductor 42. In a first non-limiting embodiment, the thermal conductor 42 is a thermally conductive sheet, such as a glass sheet. In another non-limiting embodiment, the thermal conductor 42 is a thermal paste. In yet another non-limiting embodiment, the thermal conductor 42 is a glass pipe.

Figure 3:
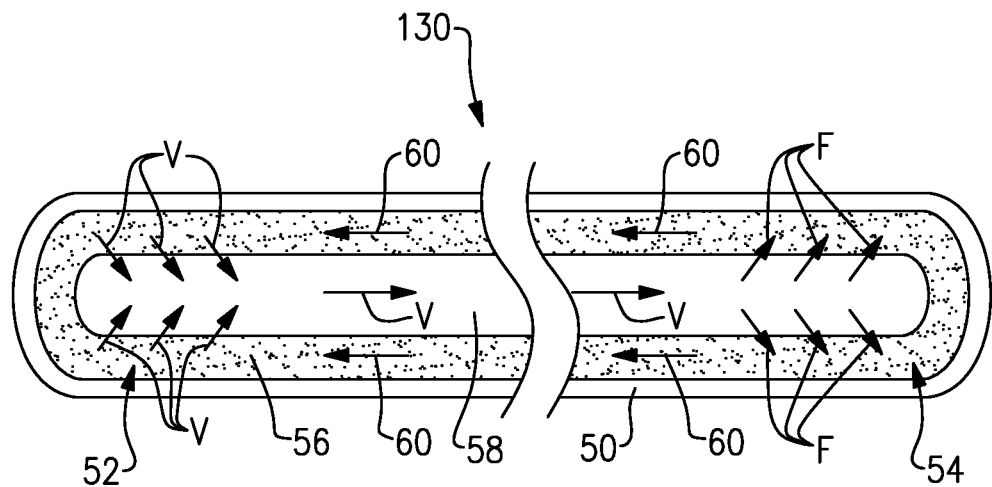
FIG. 3 illustrates an exemplary heat pipe of the cooling system of FIGS. 2A and 2B.

FIG. 3 illustrates another exemplary heat pipe 130 that may be employed by the cooling system 26 of FIGS. 2A and 2B to dissipate heat from the solar cells 28 of the photovoltaic module 18. The heat pipe 130 includes a casing 50, an evaporation section 52, a condenser section 54, a wick 56, and a vapor cavity 58. In a non-limiting embodiment, the casing 50 is made of aluminum. A working medium 60 is disposed inside the casing 50 and may be communicated through the wick 56, which is porous. The working medium 60 evaporates into a vapor V at the evaporation section 52 of the heat pipe 130. As evaporation occurs, the vapor V absorbs thermal energy. The vapor V then migrates along the vapor cavity 58 toward the condenser section 54 of the heat pipe 130. In the condenser section 54, the vapor V condenses back to fluid F and is absorbed by the wick 56, thereby releasing thermal energy. The working medium 60 may then flow back toward the evaporation section 52 via capillary forces.

With reference to FIGS. 2A, 2B, and 3, thermal management of the photovoltaic module 18 using the heat pipe 130 generally occurs in the following manner. Heat is generated and released by the solar cells 28 and is conducted into the heat pipe 130. As the heat pipe 130 absorbs the heat, the working medium 60 in the evaporation section 52 vaporizes, thereby creating a pressure gradient within the heat pipe 130. This pressure gradient forces the vapor V to flow along the vapor cavity 58 to the cooler, condenser section 54, which is located remotely from the solar cells 28. The vapor V condenses in the condenser section 54, thereby releasing latent heat to the heatsink 32. The working medium 60 is then returned to the evaporation section 52 by capillary forces developed in the wick 56. Removing the heat from the solar cells 28 in this manner maintains the photovoltaic module 18 within a desired operating temperature range.

Figure 4:
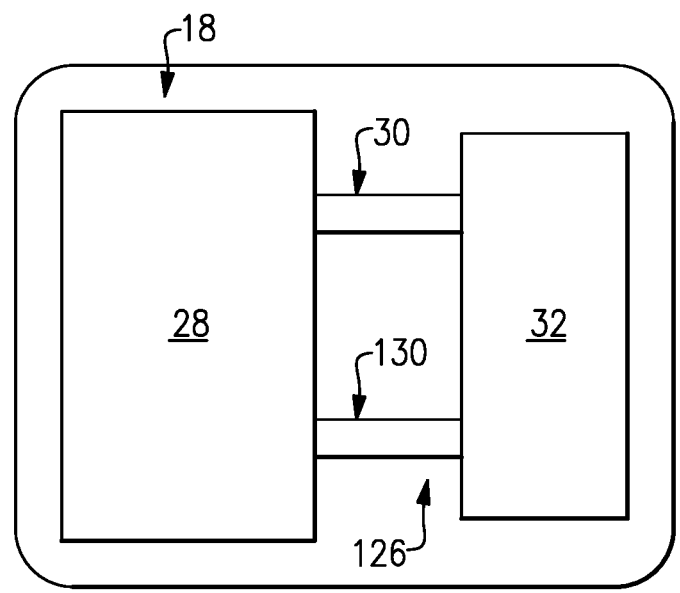
FIG. 4 illustrates another exemplary cooling system for cooling a photovoltaic module.

FIG. 4 schematically illustrates another exemplary cooling system 126 for cooling solar cells 28 of a photovoltaic module 18. In this non-limiting embodiment, the cooling system 126 includes both the heat pipe 30 and the heat pipe 130. Thus, heat transfer within the photovoltaic module 18 can be accomplished using both gravitation forces and capillary forces.

Other heat pipe designs are also contemplated within the scope of this disclosure. For example, in addition to thermosyphons which rely on gravitational forces and heat spreaders which rely on capillary forces, some heat pipes may be rotating heat pipes that rely on centrifugal forces to transfer the working medium between the evaporation and condenser sections. The cooling systems of this disclosure can include any combination of different types of heat pipes for achieving a desired level of cooling of a photovoltaic module.

Although the different non-limiting embodiments are illustrated as having specific components or steps, the embodiments of this disclosure are not limited to those particular combinations. It is possible to use some of the components or features from any of the non-limiting embodiments in combination with features or components from any of the other non-limiting embodiments.

It should be understood that like reference numerals identify corresponding or similar elements throughout the several drawings. It should be understood that although a particular component arrangement is disclosed and illustrated in these exemplary embodiments, other arrangements could also benefit from the teachings of this disclosure.

The foregoing description shall be interpreted as illustrative and not in any limiting sense. A worker of ordinary skill in the art would understand that certain modifications could come within the scope of this disclosure. For these reasons, the following claims should be studied to determine the true scope and content of this disclosure.

What is claimed is:

1. An assembly, comprising:
a photovoltaic module including a solar cell; and
a cooling system including a heatsink axially displaced from said photovoltaic module and a heat pipe extending between said solar cell and said heatsink and adapted to dissipate heat from said solar cell,
wherein said cooling system comprises a plurality of separate heat pipes extending between said photovoltaic module and said heat sink.

2. The assembly as recited in claim 1, wherein said photovoltaic module is mounted to a roof component of a vehicle.

3. The assembly as recited in claim 1, wherein said cooling system includes a thermal conductor disposed between said solar cell and said heat pipe.

4. The assembly as recited in claim 3, wherein said thermal conductor is a thermally conductive sheet.

5. The assembly as recited in claim 3, wherein said thermal conductor is a thermal grease.

6. The assembly as recited in claim 1, wherein said heatsink includes a metallic body and a plurality of cooling fins that protrude from said metallic body.

7. The assembly as recited in claim 1, wherein said heat pipe includes an evaporation section proximate said solar cell and a condenser section proximate a heatsink of said cooling system.

8. The assembly as recited in claim 7, comprising a working medium movable inside said heat pipe between said evaporation section and said condenser section.

9. The assembly as recited in claim 8, wherein said working medium moves via gravity or capillary forces.

10. The assembly as recited in claim 1, wherein said heat pipe is a thermosyphon.

11. The assembly as recited in claim 1, wherein said assembly is a vehicle assembly.

12. The assembly as recited in claim 1, wherein said heat sink is offset to the rear of said photovoltaic module.

13. The assembly as recited in claim 1, wherein said heat sink and said photovoltaic module do not overlap one another.

14. The assembly as recited in claim 1, wherein said heat sink is an aluminum heat sink.

15. The assembly as recited in claim 1, wherein said heat pipe is a rotating heat pipe that relies on centrifugal forces to dissipate the heat.

16. An assembly, comprising:
a photovoltaic module including a solar cell;
a cooling system including a heatsink axially displaced from said photovoltaic module and a heat pipe extending between said solar cell and said heatsink and adapted to dissipate heat from said solar cell, and
said cooling system includes a thermal conductor disposed between said solar cell and said heat pipe,
wherein said thermal conductor is a glass pipe.

17. An assembly, comprising:
a photovoltaic module including a solar cell; and
a cooling system including a heatsink axially displaced from said photovoltaic module and a heat pipe extending between said solar cell and said heatsink and adapted to dissipate heat from said solar cell;
said heat pipe includes an evaporation section and a condenser section elevated relative to said evaporation section.

18. An assembly, comprising:
a photovoltaic module including a solar cell; and
a cooling system including a heatsink axially displaced from said photovoltaic module and a heat pipe extending between said solar cell and said heatsink and adapted to dissipate heat from said solar cell,
said heat pipe is a thermosyphon that relies on gravitation forces to dissipate the heat, and comprising a second heat pipe that is a heat spreader that relies on capillary forces to dissipate the heat.

19. An assembly, comprising:
a photovoltaic module including a solar cell;
a cooling system adapted to dissipate heat from said solar cell, said cooling system including:
   a heat sink; and
   a heat pipe extending between said solar cell and said heat sink and including an evaporation section, a condenser section, and an angled section that elevates said condenser section relative to said evaporation section.

* * * * *